United States Patent [19]
Hartley et al.

[11] Patent Number: 6,111,441
[45] Date of Patent: Aug. 29, 2000

[54] ZERO POWER POWER-ON RESET BOOTSTRAPPING METHOD AND APPARATUS FOR ULTRA LOW-POWER INTEGRATED CIRCUIT PACKAGING

[75] Inventors: Lee F. Hartley, Uxbridge; Kai Di Feng, North York, both of Canada

[73] Assignee: International Business Machines Corporation, Armonk, N.Y.

[21] Appl. No.: 09/251,822

[22] Filed: Feb. 17, 1999

[30]    Foreign Application Priority Data

Aug. 14, 1998 [CA]  Canada ................................. 2245113

[51] Int. Cl.[7] ..................................................... H03L 7/00
[52] U.S. Cl. .............................. 327/143; 327/198; 327/91
[58] Field of Search .................................. 327/142, 143, 327/198, 91, 94, 95

[56]          References Cited

U.S. PATENT DOCUMENTS 4,225,825  9/1980  Watts ....................................... 327/135
5,576,650  11/1996 Hirontani et al. ....................... 327/142
5,804,995  9/1998  Knuth et al. ............................ 327/143
5,894,240  4/1999  Shieh et al. ............................. 327/142

*Primary Examiner*—Timothy P. Callahan
*Assistant Examiner*—An T. Luu
*Attorney, Agent, or Firm*—Jay H. Anderson

[57]          ABSTRACT

A low power selector circuit is described which permits control of multiple configurations of an integrated circuit chip without external pull-up or pull-down resistors or additional lead frame pins. The selector circuit has a gated pull-up resistor formed on the chip, controlled by a sampling latch, When enabled by a power-on reset circuit, the latch samples voltage on the terminal input pad; the latch shuts off the pull-up resistor when a grounded terminal input pad is detected. This circuit thus samples the voltage of a pad of the chip to determine whether it has been grounded; this information may be used to control various chip functions. Very little power consumption is required.

5 Claims, 5 Drawing Sheets

ZERO POWER POWER-ON RESET BOOTSTRAPPING METHOD AND APPARATUS FOR ULTRA LOW-POWER INTEGRATED CIRCUIT PACKAGING

BACKGROUND OF THE INVENTION

1. Field of the Invention

This invention relates to a circuit for selecting internal integrated circuit chip functions and more particularly to a circuit which can select the functional operation of the integrated circuit chip without external pull-up resistors.

2. Description of Related Art

This invention enables the design of an integrated circuit chip having multiple configurations which may be selected without the use of external pull-up resistors and without the use of additional input/output pins in the integrated circuit packaging. Standardized packaging typically has a fixed number of input/output pins. For instance an 8 pin package would typically have only a single power supply voltage pin which would likely have only limited space for bonding. However although there would likely only be a single ground pin there would be, conversely a substantial amount of space on grounded portions of the lead frame used in the package to tack terminal pads of the integrated circuit to ground as desired.

Bootstrapping resistors such as pull-up or pull-down resistors while being useful solution to the problem cause complications because of size limitations and power consumption. Both of these complications are undesirable because of the small size of integrated circuitry and because of the desirability of reducing power consumption to an absolute minimum required for battery power of the circuitry.

We have found that wire bond bootstrapping of an integrated circuit inside a molded package at the time of packaging can be used to enable or disable modes of operation of the integrated circuit.

SUMMARY OF THE INVENTION

To overcome the limitations in the prior art which require the use of an external pull-up or pull-down resistor and to minimize power consumption has will become apparent upon reading and understanding the present specification present invention discloses a system in which multiple configurations and integrated circuit chips operation may be controlled without external pull up or pull down resistors or additional lead frame pins.

One aspect of the invention provides low-power selector circuit contained within the integrated circuit chip being controlled for selecting between a plurality of functions of the integrated circuit chip comprising:

a gated pull up resistor for connection to a power supply and connected to an input output terminal of the integrated circuit chip;

a sampling latch;

a power-on reset circuit;

the sampling latch being adapted on enablement by the power-on reset circuit to sample voltage on the input/output terminal of the integrated circuit chip on powering up and output a control signal to control functions of the chip, and; if the input/output terminal has been grounded to gate the pull-up resistor into an off state.

In another aspect of the invention the gated pull-up resistor is connected between an externally accessible input/output terminal pad of the integrated circuit chip and the power supply terminal pad to which power can be supplied to said chip. The sampling latch has a sampling input connected to the input/output terminal to sample the voltage level at the terminal and also has an output for producing 8 control signal directed to control functions of the chip. The power-on reset circuit is adapted to enable the latch on power-up to sample the voltage at the input/output terminal and latch that voltage to its output to output a control signal and, if the input voltage is low i.e. grounded to switch off the gate of the pull-up resistor so that power consumption will be minimized.

Preferably the gated pull up resistor consists of a gating circuit such as a transistor in the integrated circuit chip.

The sampling latch may consist of a latching flip-flop having an enabling input connected to the output of the power-on reset circuit and a latchable output for producing the control signal, and an inverted output, the output of the power-on reset circuit and the inverted output being connected to the inputs of an and gate, the output of which is connected to the control gate of the gating transistor for gating the current through the resistor.

DETAILED DESCRIPTION OF THE INVENTION

Figure 1:
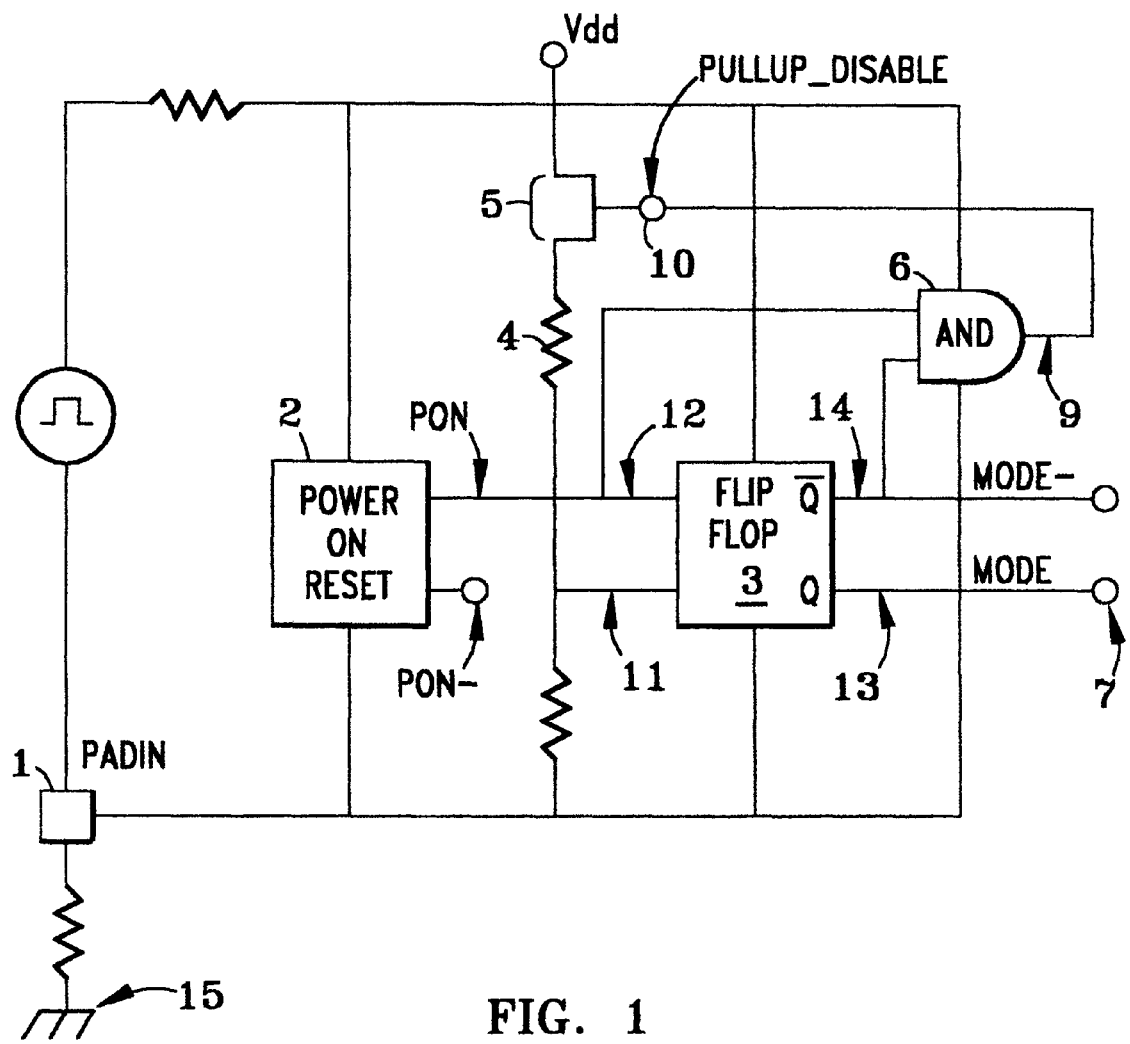
FIG. 1 is a schematic circuit of a preferred embodiment of the invention.

In the following description of the preferred embodiment of the invention references made to the coming drawings and in which is shown by way of illustration a specific embodiment in which the invention may be practiced. It will be well understood that other embodiments of the invention may be used without departing from the scope of the present invention.

In the packaging of integrated circuit chip we usually only have access for the construction of wire bonds from input/output pads on the chip to module pins of the packaging or to some contact areas on the lead frame, typically a ground plane of the frame. There is typically more space available on the frame ground; and in addition, noise and thermal considerations essentially dictate that grounded lead frames be used.

If multiple modes of operation of the integrated circuit chip are needed but extra module or packaging pins are not available or would necessitate major design changes, such as additional pins, which are typically undesirable in an industry that values standardization then another solution must be found.

It is not usually difficult to add additional input/output terminal pads to an integrated circuit chip for the purpose of mode selection, for instance, if the input/output terminal pad is grounded then operation mode one is selected; however, if the voltage level of the input/output terminal pad is high then operation mode two has been selected, for instance.

To carry on example, at packaging we can wire bond an input/output terminal pad to the lead, the same frame ground to select mode one. This does not cause much problem as a digital input has been grounded. If, however, we choose to leave the input/output terminal pad ungrounded, and which case the pad will be floating there may be a significant problem as the terminal is floating and its state is unknown. It is unacceptable in digital technology to leave a digital input floating as will be well recognized by those skilled in the art.

Another alternative(not depicted in the drawings) which alleviates the floating pad problem is to use a pull-up resistor connected between the input/output pad and the supply voltage (Vdd) of the chip. If the input/output pad of the chip is grounded it will be stable and mode 1 will have been selected. If, on the other hand, the pad is not grounded then the pull-up resistor will pull its voltage up to Vdd to select mode 2. Again this is stable as the pad is not floating. However, in this case there is a further problem. With the pad grounded a current, which we will call Idc, flows through the pull-up resistor. If we want to reduce the current flow, to reduce losses for battery operation, (taking into account that a modern design may use only 50 nA for a whole integrated circuit chip when in its power saving shutdown mode) we would attempt to use on-chip resistors to reduce the current. Unfortunately, at this time, economical on-chip resistors may have values of about 100 Kohms. For a 3 volt supply this would result in an Idc current of 30 microamps. This is unacceptable, being many orders of magnitude larger than the shutdown current consumption of the entire chip.

We have found that one solution to this problem is the use of a gated pull-up resistor formed on an integrated circuit chip that is controlled by a latch that samples the voltage on the terminal input pad and shuts off the pull-up resistor if it detects a low, i.e. a grounded input terminal pad. When activated this would reduce the current Idc through the pull-up resistor to zero.

Figure 2:
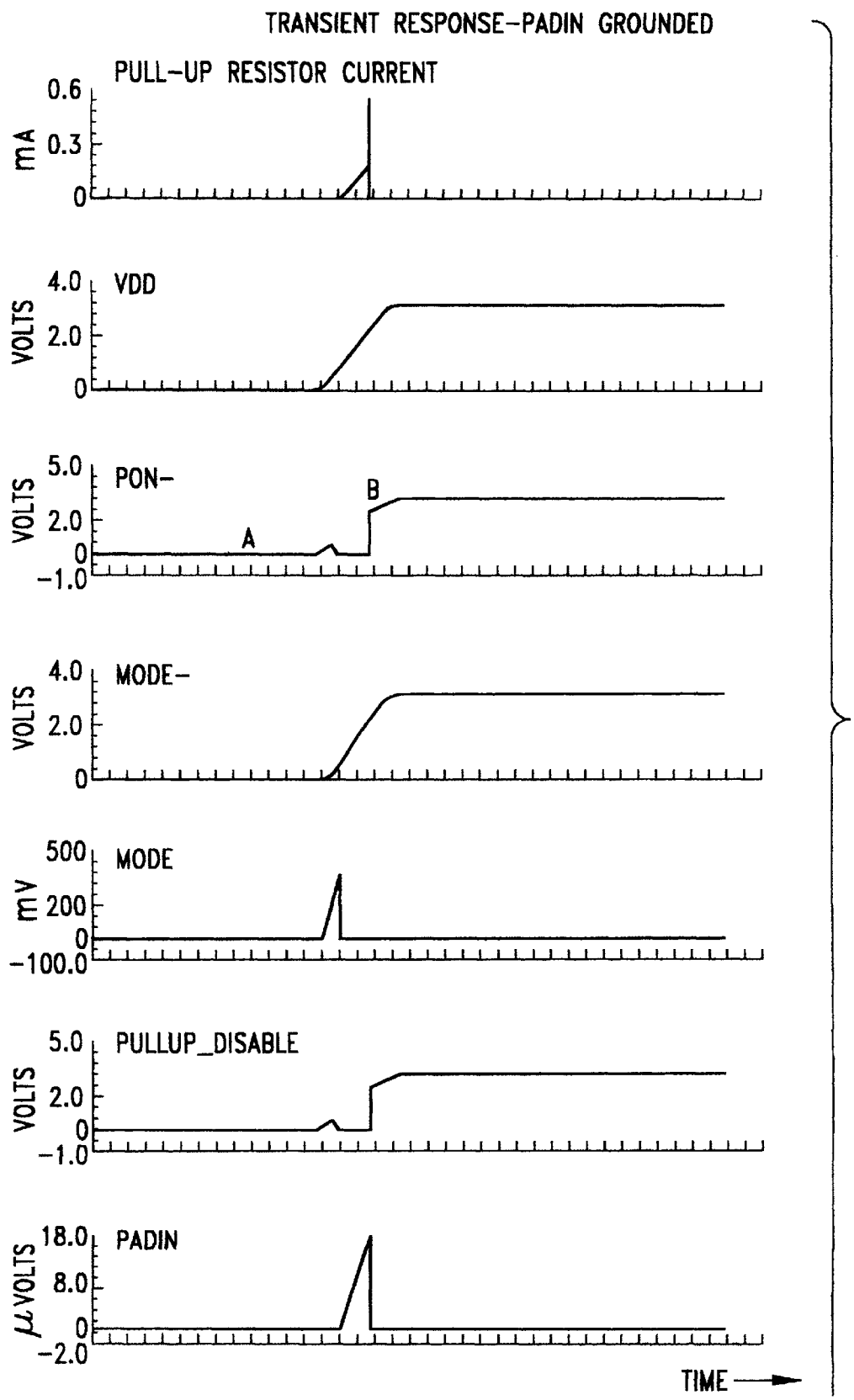
FIG. 2 is a diagram illustrating the behavior of the embodiment of FIG. 1 including the power-on reset voltage of the circuit of the invention and the power supply voltage in relation to time for the case where the input pad PADIN of the integrated circuit chip is grounded.

Referring to FIG. 1 which shows one embodiment of the invention it may be seen that the circuit of the invention includes a gated pull-up resistor namely resistor 4 and FET transistor gate 5 which is controlled through its gate 10 by the output 9 of And gate 6 which receives its input controls from Power-On Reset circuit 2 and the inverted Q output 14 of sense latch flip flop 3. The Power-On Reset circuit 2 enables sense latch 3 when the voltage supplied to it by Vdd the supply voltage exceeds a threshold voltage Vth on power-up. Further details of Power-On Reset circuit 2 will not be given as there are many implementations familiar to those skilled in the art. The sense input 11 of latch 3 as well as one end of pull-up resistor 4 is connected to input/output terminal pad 1 of the integrated circuit containing the circuit of the invention. This pad 1 may be grounded by ground 15, for example, by being wirebonded to the ground of the circuit package lead frame as discussed above as shown in FIG. 3, or left ungrounded as shown in FIG. 4, in which case pull-up resistor 4 will cause the input 11 of latch 3 to be pulled to the supply voltage level Vdd. The output signal 7 from the latched output 13 of latch 3 is used to control the functions of other circuitry of the integrated circuit chip (not shown) to obtain the desired functions. For instance, output level 1 (high) on output 7 may result in one mode of operation and a level 0 will result in another. The output 13 will hold whatever state was present on pad 1 when the rising edge of the output of the power-on reset circuit 2 exceeded a preset threshold voltage Vth as shown in FIG. 2. The output of the power-on reset circuit is held low by the circuit until the supply voltage Vdd to it exceeds Vth. Comparison of the final states of MODE and MODE- in FIG. 2 and FIG. 5 clearly indicate the functionality of the circuit in the presence (FIG. 2) or absence (FIG. 5) of a connection to ground.

The operation of the circuit of the invention and its advantages may be appreciated from the following description of its operation:

The power-on reset circuit is conveniently supplied by the same supply voltage Vdd that powers the integrated circuit chip.

As Vdd increases in voltage on power-up, but prior to reaching Vth, the output 9 of And gate 6 is kept low, i.e. 0 because the output (PON) of the power-on reset circuit 2 is 0 as shown in region A of FIG. 2. Under this circumstance the state of FET transistor 5 is ON, and if terminal pad 1 of the chip is wirebonded to ground then current will flow through transistor 5 and pull up resistor 4 to ground through wirebond 15.

If on the other hand, the wirebond is not made then no current will flow through pull up resistor 4 and the voltage present at pad 1 will equal Vdd, the supply voltage, i.e.. the pad voltage is pulled up to the supply voltage Vdd. As we have still not crossed the Vth threshold the power-on reset voltage output from power-n reset circuit 2 Is still low.

At a later point in time during power-on, as shown in region B of the power-on trace of FIG. 2 when the supply voltage Vdd has exceeded Vth, the threshold voltage, then the output (PON) of power-on reset circuit 2 will rapidly rise from 0 (low state) to 1 (high state), and on that rising edge, sensing latch flip flop 3 will be enabled by the output of power-on reset 2 at input 12, latching the state of pad 1 sensed at input 11 onto the output 13 of latch 3. As the output of power-on reset circuit 2 is high the output of And gate 6 will depend on the inverse 14 of the latched output 13 of latch 3.

If the wirebond 15 is made to ground, (as illustrated in FIG. 4. which shows pad 1 connected to the ground plane of a lead frame 40 during the course of manufacturing, prior to encapsulation and lead severance) then output 13 of latch 3 will be 0 and consequently the inverse output 14 will be 1, thus And gate 6 will output a level 1 output (high) causing gate 5 to turn off (note the inverting behavior of gate 5). This will result in the current through pull up resistor 4 being reduced to zero after the state of pad 1 has been sensed, with power savings resulting. FIG. 2 illustrates the response at several points in the circuit as the power supply voltage Vdd is applied, eg. at turn on.

Figure 3:
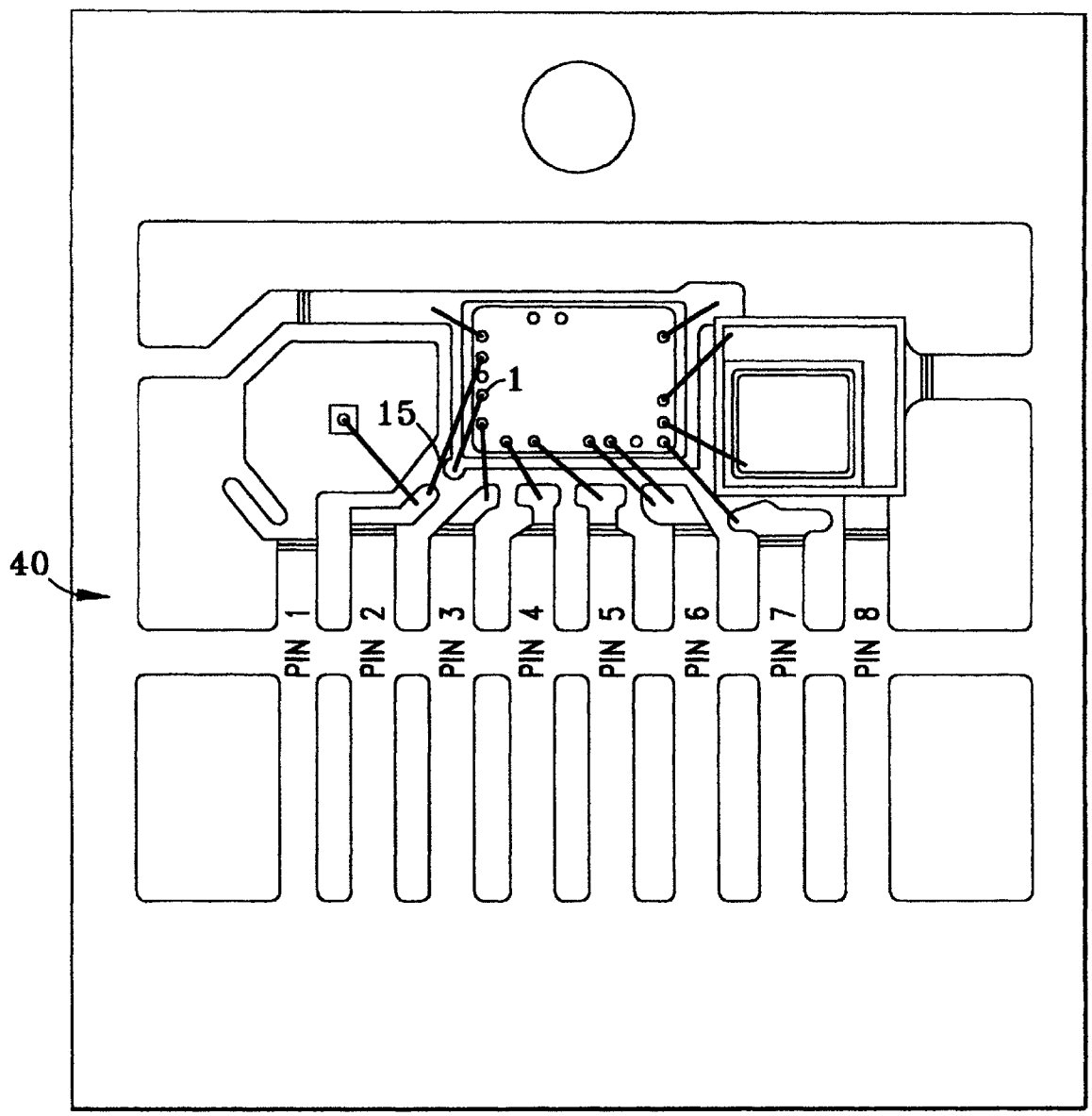
FIG. 3 is a diagram of a lead frame for an integrated circuit package depicting connections to terminal pads of an integrated circuits jet in which an input/output terminal pad of the chip has been grounded.
Figure 4:
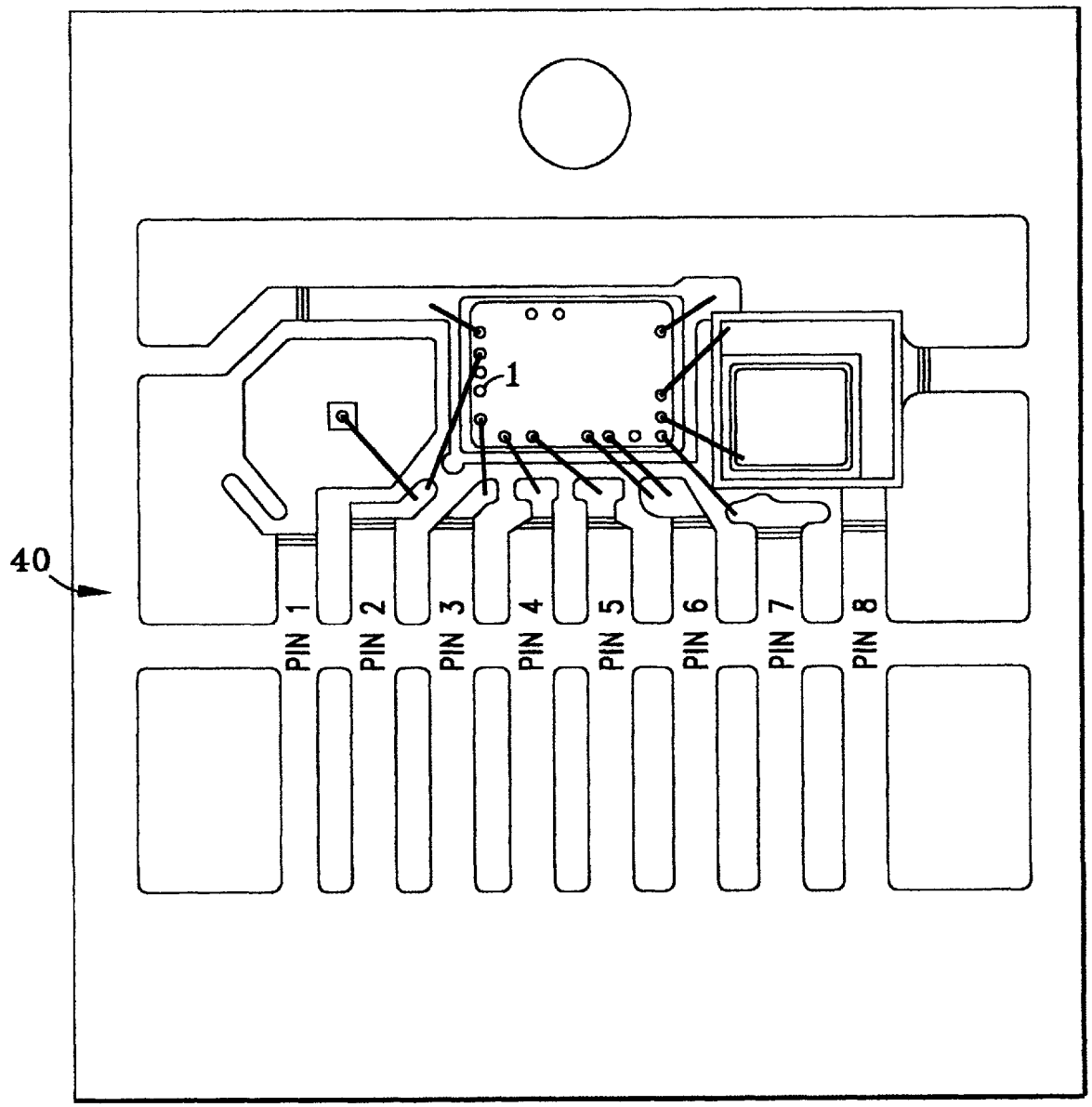
FIG. 4 is a diagram of a lead frame for an integrated circuit package depicting connections to terminal pads of an integrated circuit chip in which can input/output terminal pad of the chip previously depicted in figure three has been left ungrounded.
Figure 5:
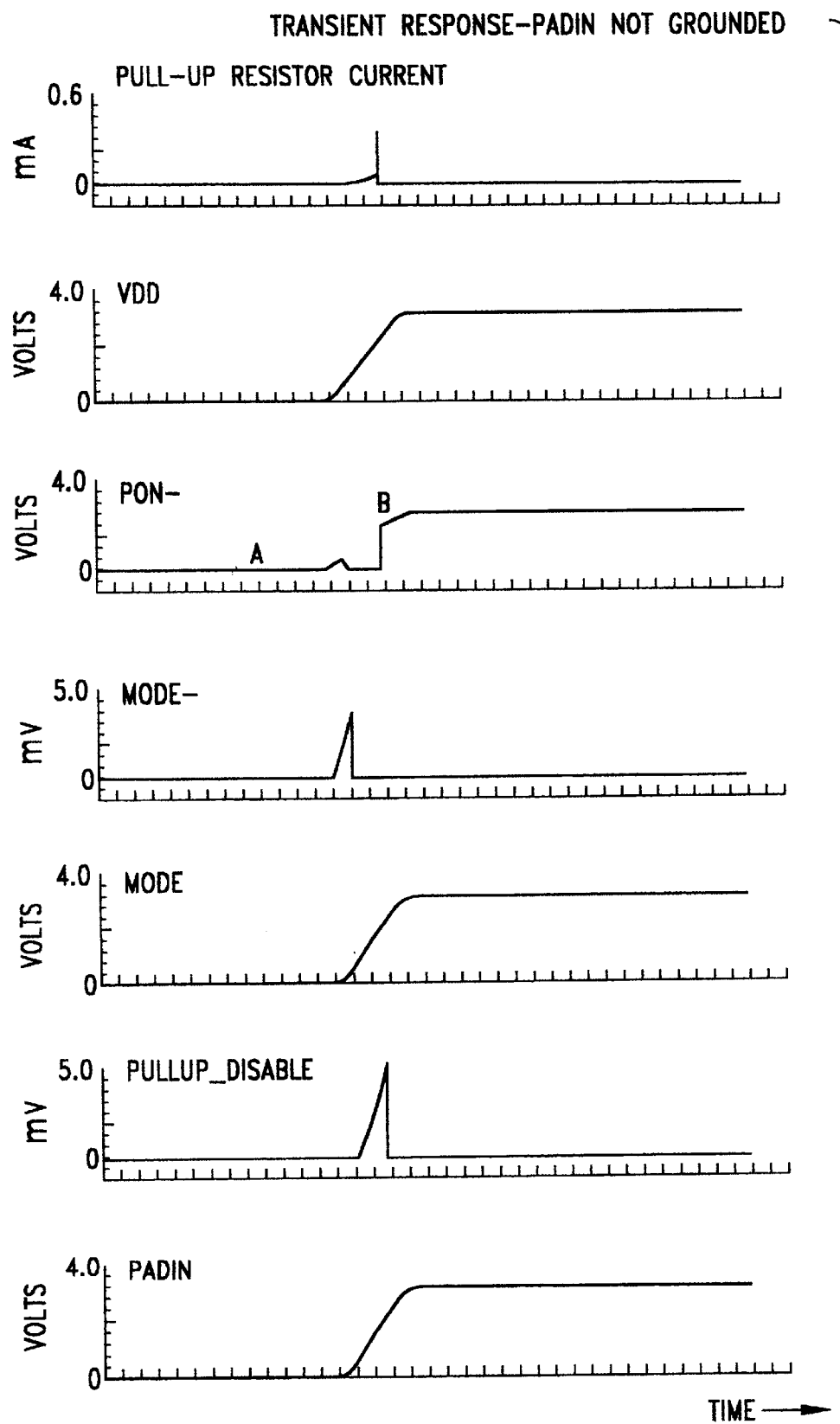
FIG. 5 is a diagram illustrating the behavior of the embodiment of FIG. 1 including the power-on reset voltage of the circuit of the invention and the power supply voltage in relation to time for the case where the input pad PADIN of the integrated circuit chip is NOT grounded.

On the other hand, if wirebond 15 is not present, i.e. if the pad was not grounded, (as shown in FIG. 3, which shows an ungrounded pad 1 of a chip contained on a lead frame assembly prior to encapsulation and lead severance), then on power-up the when the supply voltage Vdd exceeds Vth the voltage of pad 1 will be pulled up to Vdd, i.e.. state 1. The output 13 of latch 3 will be latched high to produce a high output control signal 7 for use by other circuitry of the chip as described. The inverse output 14 of latch 3 will be set to 0 and the output of And gate 6 will be 0, thus FET transistor 5 will stay on. This is of little consequence as this situation can occur only if pad 1 was not grounded. Therefore resistor 4 will not be conducting current as the voltage of pad 1 will have been pulled up to supply voltage Vdd. FIG. 5 illustrates the response at several points in the circuit as the power supply voltage Vdd is applied, eg. at turn on.

As will be realized from this description, the circuit of the invention effects a sampling of the voltage of a pad of the integrated circuit chip to determine whether or not it has been grounded and uses this information to control the functions of other circuitry on the chip. It accomplishes this with very little power consumption, unlike prior art devices, and requires no external resistive components.

The present invention is not limited to the specifically disclosed embodiments, and variations and modifications may be made without departing from the scope of the present invention.

The embodiments of the invention in which an exclusive property or privilege is claimed are defined as follows:

1. A low-power selector circuit contained within an integrated circuit chip for selecting among a plurality of functions of said integrated circuit chip comprising:

a gated and pull-up resistor for connection to a power supply and connected to an input/output terminal pad of said integrated circuit chip;

a sampling latch;

a power-on reset circuit;

said sampling latch being adapted on enablement by said power-on reset circuit to sample the voltage of the input/output terminal pad of said integrated circuit chip on power-up, to output a control signal to control functions of said integrated circuit chip, and in a predetermined situation to gate said pull up resistor to an off state.

2. A low-power selector circuit in accordance with claim 1 in which said gated pull up resistor is connected between an externally accessible input/output terminal pad of said integrated circuit chip and a power supply terminal to which power can be supplied to said chip;

said sampling latch having a sampling input connected to said input/output terminal to sample the voltage level at said input/output terminal pad and having an output for producing the control signal directed to control functions of said integrated circuit chip;

said power-on reset circuit being adapted to enable said latch, on power-up, to enable said latch to sample the input voltage at said input/output terminal by latching said input voltage to the output of said latch to output the control signal; and if said input voltage is low to switch off said gate of said pull-up resistor.

3. The selector circuit of claim 2 wherein said gated pull up resistor comprises a gating circuit connected between said power supply terminal and one end of said pull up resistor, the other end of said pull up resistor being connected to said input/output terminal.

4. The selector circuit of claim 3 wherein said gating circuit comprises a gating transistor in said integrated circuit chip.

5. The selector circuit of claim 3 wherein said sampling latch comprises a latching flip flop having an enabling input connected to the output of said power-on reset circuit, a latchable output for producing said control signal, and an inverted output;

the output of said power-on reset circuit and said inverted output being connected to the inputs of an And gate, the output of which is connected to the gate of said gating transistor for gating supply voltage to it to prevent current flowing after sampling has been completed.

* * * * *